(12) United States Patent
van der Heijden et al.

(10) Patent No.: US 12,224,713 B2
(45) Date of Patent: Feb. 11, 2025

(54) MULTIPLE-STAGE DOHERTY POWER AMPLIFIERS IMPLEMENTED WITH MULTIPLE SEMICONDUCTOR TECHNOLOGIES

(71) Applicant: NXP USA, Inc., Austin, TX (US)

(72) Inventors: Mark Pieter van der Heijden, Eindhoven (NL); Joseph Staudinger, Gilbert, AZ (US); Elie A. Maalouf, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 638 days.

(21) Appl. No.: 17/360,821

(22) Filed: Jun. 28, 2021

(65) Prior Publication Data

US 2022/0416725 A1 Dec. 29, 2022

(51) Int. Cl.
| | | |
|---|---|---|
| H03F 1/02 | (2006.01) | |
| H01L 23/66 | (2006.01) | |
| H03F 3/195 | (2006.01) | |
| H03F 3/21 | (2006.01) | |
| H03F 3/213 | (2006.01) | |

(52) U.S. Cl.
CPC .......... H03F 1/0288 (2013.01); H01L 23/66 (2013.01); H03F 3/211 (2013.01); *H01L 2223/6644* (2013.01); *H03F 2200/451* (2013.01)

(58) Field of Classification Search
CPC .. H03F 1/0288; H03F 3/211; H03F 2200/451; H03F 1/22; H03F 2200/402; H03F 2200/42; H03F 2200/48; H03F 2200/54; H03F 2200/75; H03F 3/195; H03F 3/213; H03F 3/24; H03F 1/32; H01L 23/66; H01L 2223/6644

USPC .......................................................... 330/295
See application file for complete search history.

(56) References Cited

U.S. PATENT DOCUMENTS

| | | | |
|---|---|---|---|
| 6,545,534 B1 * | 4/2003 | Mehr | H03G 1/0088 |
| | | | 330/69 |
| 9,030,255 B2 | 5/2015 | Liss | |
| 9,774,301 B1 | 9/2017 | Maalouf et al. | |
| 10,250,197 B1 * | 4/2019 | Schultz | H01L 23/66 |

(Continued)

FOREIGN PATENT DOCUMENTS

| | | |
|---|---|---|
| EP | 1271765 A2 | 2/2003 |
| WO | 2021084291 A1 | 5/2021 |

*Primary Examiner* — Andrea Lindgren Baltzell
*Assistant Examiner* — Khiem D Nguyen

(57) ABSTRACT

A device includes an integrated circuit (IC) die. The IC die includes a silicon germanium (SiGe) substrate, a first RF signal input terminal, a first RF signal output terminal, a first amplification path between the first RF signal input terminal and the first RF signal output terminal, a second RF signal input terminal, a second RF signal output terminal, and a second amplification path between the second RF signal input terminal and the second RF signal output terminal. The device includes a first power transistor die including a first input terminal electrically connected to the first RF signal output terminal and a second power transistor die including a second input terminal electrically connected to the second RF signal output terminal. The first amplification path can include two heterojunction bipolar transistors (HBTs) connected in a cascode configuration and the second amplification path can include two HBTs connected in a cascode configuration.

20 Claims, 6 Drawing Sheets

(56) References Cited

U.S. PATENT DOCUMENTS

| | | |
|---|---|---|
| 10,284,147 B2 | 5/2019 | Wu et al. |
| 10,594,266 B2 | 3/2020 | Krehbiel et al. |
| 2004/0174213 A1* | 9/2004 | Thompson ............ H03F 1/0288 330/124 R |
| 2013/0278332 A1 | 10/2013 | Ji et al. |
| 2019/0140598 A1 | 5/2019 | Schultz et al. |

* cited by examiner

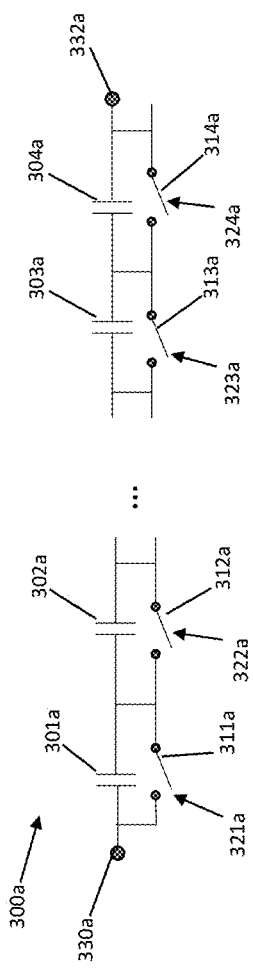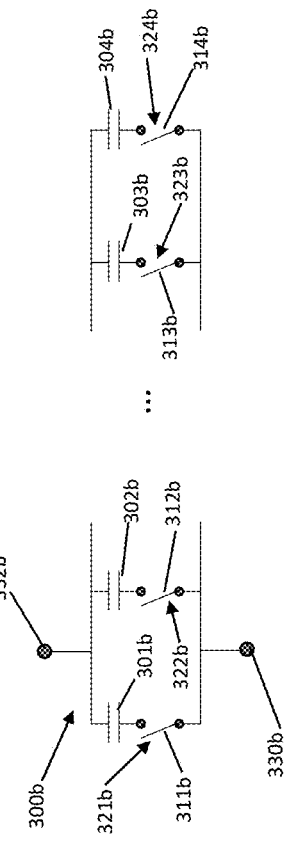
FIG. 3A
FIG. 3B

MULTIPLE-STAGE DOHERTY POWER AMPLIFIERS IMPLEMENTED WITH MULTIPLE SEMICONDUCTOR TECHNOLOGIES

TECHNICAL FIELD

Embodiments of the subject matter described herein relate generally to multiple-stage power amplifiers.

BACKGROUND

Gallium nitride (GaN) power transistors are increasingly being utilized in high-power amplifier circuits for cellular base stations and other systems to increase efficiency and operating bandwidth. GaN transistors have proven to provide high amplifier performance due to their relatively high power density and relatively high unit current gain frequency, when compared with some of their silicon based counterparts. The higher power density allows for smaller die peripheries for a given level of output power. This may result in lower drain-source capacitance, CDS, and higher output impedances with wider output bandwidth, when compared with silicon devices.

However, GaN transistors also have several disadvantages when compared with silicon-based transistors. For example, the current cost of GaN is significantly higher than that of silicon, putting GaN die area and integration at a premium. Further, GaN transistor compression characteristics challenge digital pre-distortion linearization circuits. GaN transistors tend to have a relatively slow, gradual amplitude compression, and the transmission phase exhibits an expansion during drive up.

Further still, the GaN input characteristics may significantly limit performance. More specifically, GaN input impedance tends to be very low with a high Q-factor, and the gate-source capacitance, $C_{GS}$, varies considerably over drive. In a Doherty power amplifier with a GaN main amplifier and a GaN peaking amplifier, the GaN peaking amplifier transitions between an off state and an on state depending on the radio frequency (RF) drive level and signal envelope. As these transitions occur, the input impedance exhibits a large variation and may be highly mismatched to a preceding 50 Ohm gain stage. This mismatch may produce considerable reflection and poor Input Return Loss (IRL). Further, the resulting restricted bandwidth on the input can limit the overall amplifier bandwidth. These and other characteristics of GaN transistors make them impractical or unsuitable for use in many conventional amplifier topologies.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 3A is a schematic diagram of a variable capacitor network in which a number of capacitors are coupled to one another in series that may be incorporated into a driver amplifier, in accordance with an example embodiment.

FIG. 3B is a schematic diagram of a variable capacitor network in which a number of capacitors are coupled to one another in parallel that may be incorporated into a driver amplifier, in accordance with an example embodiment.

DETAILED DESCRIPTION

Figure 1:
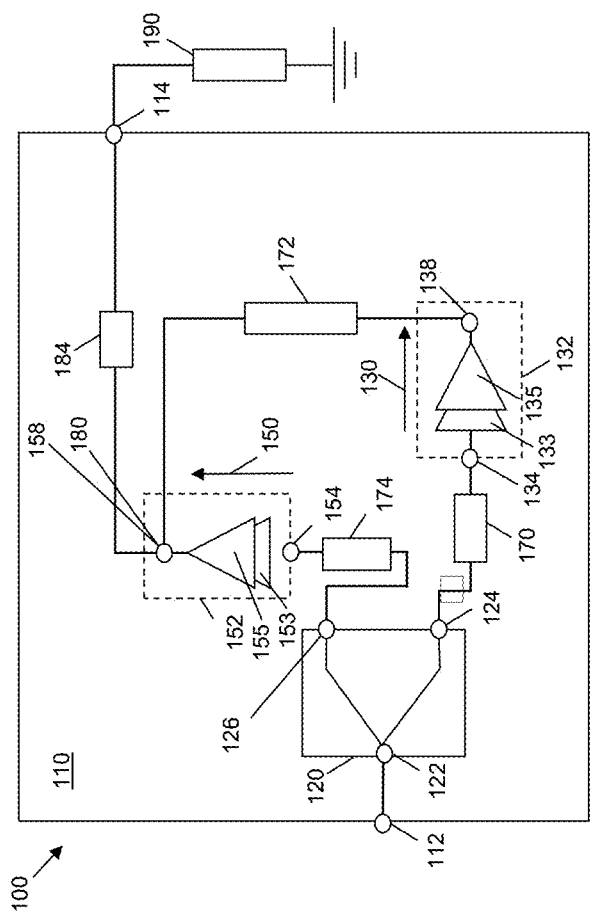
FIG. 1 is a schematic diagram of a Doherty amplifier, in accordance with an example embodiment.

Various embodiments of the inventive subject matter include a multiple-stage amplifier with a driver stage integrated circuit (IC) die including heterojunction bipolar transistors (HBT) implemented using silicon germanium (SiGe) or III-V semiconductor materials (e.g., GaN, gallium arsenide (GaAs), gallium phosphide (GaP), indium phosphide (InP), indium antimonide (InSb)) final stage IC die. The amplifier's final stage amplifiers may also be implemented using III-V materials. More specific embodiments of a multiple-stage amplifier include a SiGe driver stage IC die electrically coupled to a GaN final stage IC die in a cascade amplifier arrangement. The SiGe driver stage IC die functions as a pre-match impedance conditioner and gain enhancer for the GaN final stage IC die.

Doherty amplifiers are amplifiers commonly used in wireless communication systems. Doherty amplifiers include separate amplification paths—typically a carrier path and a peaking path. During operation, at low input power levels, the carrier amplification path is conductive, while the peaking path is non-conductive. As the magnitude of an input signal increases beyond a threshold value, the peaking path will become conductive. At that time, the operation of the peaking amplification path affects the load observed by the amplifier's carrier path. This change in apparent load reduces the efficiency of the amplifier's carrier path as well as the overall efficiency of the amplifier.

Consequently, the overall efficiency and linearity of a Doherty amplifier can be affected by the manner in which the peaking amplifier begins conducting when the power level of the input signal to the Doherty amplifier increases beyond a threshold value. Generally, it is desirable that the peaking amplifier remain in an off state and be non-conducting for signal levels below that threshold value and turn on abruptly for signal levels at or above the threshold.

Even so, in real-world Doherty amplifier devices, there are trade-offs to consider in determining the turn-on characteristics of the device's peaking amplifier. Specifically, if the peaking amplifier is configured to turn on-abruptly at the point that the power level of the input signal has met or exceeded the threshold value, the Doherty amplifier will run more efficiently, but at the expense of the amplifier's linearity. If the desire is to maintain the Doherty amplifier's linearity, the peaking amplifier is typically configured to be operational over the full 8 decibel (dB) peak-to-average ratio (PAR) range of the carrier amplifier. Although this enables more linear amplifier performance overall, this improvement is typically at the cost of a less-efficient amplifier due to direct current losses within the amplifier arising from the necessary biasing of the peaking power amplifier into an operational state.

In the present Doherty amplifier design, dedicated driver stages are configured to exhibit non-linear gain attributes to enable more linear operation of the Doherty amplifier while achieving efficiency at back-off power levels. Specifically, the amplifier driver stages include non-linear gain cores implemented using heterojunction bipolar transistor (HBT) devices. The transistors are arranged in a cascode configuration and are configured to have variable gain expansion. The gain attributes of the driver stage amplifiers are controlled by adjusting or modifying a feedback capacitance coupled across the cascode amplifier's collector terminal (common base stage) and base terminal (common emitter stage).

Specifically, the dedicated driver stage amplifiers are configured to exhibit gain expansion. This gain expansion allows for abrupt turn-on of the amplifier peaking power amplifier, which may result in increases in amplifier efficiency, while also potentially resulting in improved amplifier AMAM linearity.

Amplifier devices that utilize the various embodiments described herein may exhibit relatively flat gain and phase responses (AM/AM and AM/PM responses), when compared with conventional devices. Accordingly, digital pre-distortion (DPD) circuitry implemented prior to the amplifier embodiments in the transmit chain may be less complex and/or costly. Essentially, the composite amplifier embodiments discussed herein may have improved gain, broader bandwidth, and improved drive-up characteristics when compared with conventional single-stage and other two-stage amplifiers.

In embodiments, the driver amplifier stages for both the carrier and peaking paths of a Doherty amplifier may be implemented in the same IC die (e.g., a die fabricated using SiGe materials), enabling reductions in overall Doherty amplifier package size and complexity. Optionally, with such an IC die, the carrier driver stage amplifier and the peaking driver stage amplifier may be rotationally offset from one another within the die to provide increased electrical isolation between the carrier and peaking amplification paths through the IC die containing the carrier and peaking driver stage amplifiers. In an embodiment, the carrier driver stage amplifier and the peaking driver stage amplifier may be rotationally offset from one another within the IC die by about 90 degrees to provide desired isolation and minimize electromagnetic coupling between the carrier path through the carrier driver stage amplifier and the peaking path through the peaking driver stage amplifier. In other embodiments, the carrier driver stage amplifier and the peaking driver stage amplifier may be implemented in separate IC dies.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

As used herein, the term "transistor" may mean a field effect transistor (FET), a bipolar junction transistor (BJT), or another type of transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. A "BJT" transistor may be a heterojunction bipolar transistor (HBT). The description below refers to a transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. For example, using terminology associated with BJTs, a "control terminal" refers to a base terminal of a transistor, and first and second current-conducting terminals refer to collector and emitter terminals (or vice versa) of a transistor.

The terms "integrated circuit die" and "IC die" mean a single, distinct die within which one or more circuit components (e.g., transistors, passive devices, and so on) are integrated and/or directly physically connected. The term "SiGe . . . IC die" (e.g., as in a "SiGe driver stage IC die") means an integrated circuit die that includes one or more SiGe transistors. For example, a "SiGe . . . IC die" is a die that includes one or more SiGe HBTs formed in and/or on a SiGe substrate, a SiGe-on-insulator substrate, or another suitable SiGe-based substrate. A "SiGe power transistor" or "SiGe transistor" means a transistor in which the primary current-conducting channel is formed primarily from SiGe semiconductor materials. The term "GaN . . . IC die" (e.g., as in a "GaN final stage IC die") mean an integrated circuit die that includes a GaN power transistor. For example, a "GaN . . . IC die" is a die that includes a GaN power transistor formed in and/or on a GaN substrate, a GaN-on-silicon substrate, a GaN-on-silicon carbide (SiC) substrate, a GaN on aluminum nitride (AlN) substrate, a GaN on sapphire substrate, a GaN on diamond substrate, or another suitable GaN-based hetero-epitaxy and substrate arrangement. A "GaN power transistor" or "GaN transistor" means a transistor in which the primary current-conducting channel is formed primarily from GaN semiconductor materials.

FIG. 1 is a schematic diagram of a Doherty amplifier 100, in accordance with an example embodiment. As indicated in FIG. 1 with box 110, some or all components of Doherty amplifier 100 may be implemented in a single device package or module. Doherty amplifier 100 includes RF input node 112, RF output node 114, power splitter 120, carrier amplifier path 130, peaking amplifier path 150, phase delay and impedance inversion element 172, and combining node 180, in an embodiment.

When incorporated into a larger RF system, the RF input node 112 is coupled to an RF signal source (not illustrated), and the RF output node 114 is coupled to a load 190 (e.g., an antenna or other load). The RF signal source provides an input RF signal, which is an analog signal that includes spectral energy that typically is centered around one or more carrier frequencies ($f_0$). Fundamentally, the Doherty amplifier 100 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126. According to an embodiment, the power splitter 120 may include a phase shift element that is configured to impart a first phase shift (e.g., about a 90-degree phase shift) to the peaking signal before the phase-shifted peaking signal is provided to output 126. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power.

In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally provided control signals.

The outputs 124, 126 of the power splitter 120 are connected to the carrier and peaking amplifier paths 130, 150, respectively.

The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180, where the paths 130, 150 are designed so that the amplified carrier and peaking signals arrive in phase with each other at the power combining node 180.

According to an embodiment, the carrier amplifier path 130 includes an input circuit 170 (e.g., including an impedance matching circuit), carrier amplifier 132, and a phase shift and impedance inversion element 172.

Carrier amplifier 132 includes an RF input terminal 134, an RF output terminal 138, and one or more amplification stages coupled between the input and output terminals 134, 138, in various embodiments. The RF input terminal 134 is coupled through input circuit 170 to the first output 124 of the power splitter 120, and thus the RF input terminal 134 receives the carrier signal produced by the power splitter 120.

Carrier amplifier 132 is a two-stage device and includes driver stage amplifier 133 and main stage amplifier 135. Each amplification stage of the carrier amplifier 132 includes a power transistor. More specifically, each power transistor includes a control terminal (e.g., a gate or base terminal) and first and second current-carrying terminals (e.g., a drain terminal and a source terminal or a collector terminal and an emitter terminal).

Driver stage amplifier 133 may operate with relatively low gain, while main stage amplifier 135 may have a relatively high gain. In such an embodiment, the control terminal of the driver stage amplifier 133 may be electrically connected to the RF input terminal 134, one of the current-carrying terminals of the driver stage amplifier 133 may be electrically connected to the control terminal of the main stage amplifier 135, and the other current-carrying terminal of the driver stage amplifier 133 may be electrically connected to the ground reference (or another voltage reference). One of the current-carrying terminals of the main stage amplifier 135 may be electrically connected to the RF output terminal 138, and the other current-carrying terminal of the main stage amplifier 135 may be electrically connected to the ground reference (or another voltage reference).

In addition to the power transistor(s), carrier amplifier 132 may include input and output impedance matching networks, inter-stage impedance matching circuitry, and bias circuitry, which are not illustrated in FIG. 1.

In an embodiment, driver amplifier stage 133 and final amplifier stage 135 may be implemented in separate IC die incorporated into package 110. Specifically, driver amplifier stage 133 may be implemented using HBT transistors formed in a SiGe IC die, while final amplifier stage 135 is implemented using a power transistor formed in an IC die having a III-V semiconductor substrate such as GaN. In that case, because the SiGe driver amplifier stage IC die includes an active device (i.e., the transistors of driver amplifier stage 133) and a plurality of integrated passive components associated with the input and interstage impedance matching circuits, the SiGe driver amplifier stage IC die may alternatively be considered an "Integrated Active Device" (IAD).

In such an arrangement, the SiGe die comprising driver amplifier stage 133 can be electrically coupled through a connection (e.g., a wirebond array or other DC-coupled conductive connection) to an input of the GaN die comprising final amplifier stage 135. Such connection represents a non-integrated portion of an interstage matching circuit between the driver amplifier stage 133 and the final amplifier stage 135. In other embodiments, other types of DC-coupled connections may be implemented. For example, in an alternate embodiment, the IC dies containing driver amplifier stage 133 and final amplifier stage 135 may be flip-chip dies or may be configured or packaged so that DC bias and RF signals are conveyable through a substrate to which the dies are coupled, rather than being conveyed through wirebonds or other electrical connections that are distinct from the substrate.

During operation, a received carrier path RF signal is conveyed through the input impedance matching circuit 170, which is configured to raise the impedance of carrier amplifier 132 to a higher impedance level (e.g., 50 Ohms or another impedance level) to enhance gain flatness and power transfer across the frequency band. The resulting RF signal is then amplified by driver stage amplifier 133 (i.e., the SiGe transistors of driver stage amplifier 133) at a first gain level to pre-amplify the RF signal. For example, driver stage amplifier 133 may apply a gain in a range of about 15 decibels (dB) to about 25 dB to the RF signal (e.g., about 20 dB, in some embodiments), although the gain applied by driver stage amplifier 133 may be lower or higher, as well. The amplified RF signal produced at the output of driver stage amplifier 133 is then conveyed to the GaN IC die implementing main stage amplifier 135. An inter-stage impedance matching network (not shown) matches the output impedance of driver stage amplifier 133 to the input impedance of main stage amplifier 135 to enhance gain flatness and power transfer across the frequency band.

The pre-amplified RF signal received at main stage amplifier 135 is amplified with a gain in a range of about 10 dB to about 15 dB to the RF signal (e.g., about 14 dB, in some embodiments), yielding a total gain through the carrier amplifier 132 in a range of about 25 dB to about 40 dB (e.g., about 35 dB, in some embodiments), although the gain applied by the main stage amplifier 135 and/or the total device gain may be lower or higher, as well. The amplified RF signal is produced at the output 138 of carrier amplifier 132.

The RF output terminal 138 of the carrier amplifier 132 is coupled to power combining node 180 through phase shift and impedance inversion element 172, in an embodiment. According to an embodiment, the impedance inversion element is a lambda/4 (λ/4) transmission line phase shift element (e.g., a microstrip line), which imparts about a 90-degree relative phase shift to the carrier signal after amplification by the carrier amplifier 132. A first end of the impedance inversion element 172 is coupled to the RF output terminal 138 of the carrier amplifier 132, and a second end of the phase shift element 172 is coupled to the power combining node 180.

Reference is now made to the peaking amplifier path 150, which includes a peaking amplifier 152 and an input circuit 174 (e.g., including an impedance matching circuit), in an embodiment. Peaking amplifier 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120.

As with the carrier amplifier 132, peaking amplifier 152 is a two-stage device and includes driver stage amplifier 153 and main stage amplifier 155. Driver stage amplifier 153 may operate with relatively low gain, while main stage amplifier 155 may have a relatively high gain. In such an embodiment, the control terminal of the driver stage amplifier 153 may be electrically connected to the RF input terminal 154, one of the current-carrying terminals of the driver stage amplifier 153 may be electrically connected to the control terminal of the main stage amplifier 155, and the other current-carrying terminal of the driver stage amplifier 153 may be electrically connected to the ground reference (or another voltage reference). One of the current-carrying terminals of the main stage amplifier 155 may be electrically connected to the RF output terminal 158, and the other current-carrying terminal of the main stage amplifier 155 may be electrically connected to the ground reference (or another voltage reference).

In addition to the power transistor(s), peaking amplifier 152 may include input and output impedance matching networks, inter-stage impedance matching circuitry, and bias circuitry, which are not illustrated in FIG. 1.

In an embodiment, peaking amplifier stage 153 and final amplifier stage 155 may be implemented in separate IC die incorporated into package 110. Specifically, driver amplifier stage 153 may be implemented using HBT transistors formed in a SiGe IC die, while final amplifier stage 155 can be implemented using a transistor formed in a GaN IC die. In that case, because the SiGe driver amplifier stage IC die includes an active device (i.e., the transistor of driver amplifier stage 153) and a plurality of integrated passive components associated with the input and interstage impedance matching circuits, the SiGe driver amplifier stage IC die may alternatively be considered an "Integrated Active Device" (IAD).

In such an arrangement, the SiGe die comprising driver amplifier stage 153 can be electrically coupled through a connection (e.g., a wirebond array or other DC-coupled conductive connection) to an input of the GaN die comprising final amplifier stage 155. Such connection represents a non-integrated portion of an interstage matching circuit between the driver amplifier stage 153 and the final amplifier stage 155. In other embodiments, other types of DC-coupled connections may be implemented. For example, in an alternate embodiment, the IC dies containing driver amplifier stage 153 and final amplifier stage 155 may be flip-chip dies, or may be configured or packaged so that DC bias and RF signals are conveyable through a substrate to which the dies are coupled, rather than being conveyed through wirebonds or other electrical connections that are distinct from the substrate.

During operation, a peaking path RF signal received is conveyed through the input impedance matching circuit 174, which is configured to raise the impedance of peaking amplifier 152 to a higher impedance level (e.g., 50 Ohms or another impedance level) to enhance gain flatness and power transfer across the frequency band. The resulting RF signal is then amplified by driver stage amplifier 153 (i.e., the SiGe transistors of driver stage amplifier 153) at a first gain level to pre-amplify the RF signal. For example, driver stage amplifier 153 may apply a gain in a range of about 15 decibels (dB) to about 25 dB to the RF signal (e.g., about 20 dB, in some embodiments), although the gain applied by driver stage amplifier 153 may be lower or higher, as well. The amplified RF signal produced at the output of driver stage amplifier 153 is then conveyed to the GaN IC die implementing main stage amplifier 155. An inter-stage impedance matching network (not shown) matches the output impedance of driver stage amplifier 153 to the input impedance of main stage amplifier 155 to enhance gain flatness and power transfer across the frequency band.

The pre-amplified RF signal received at main stage amplifier 155 is amplified with a gain in a range of about 10 dB to about 15 dB to the RF signal (e.g., about 14 dB, in some embodiments), yielding a total gain through the peaking amplifier 152 in a range of about 25 dB to about 40 dB (e.g., about 35 dB, in some embodiments), although the gain applied by the main stage amplifier 155 and/or the total device gain may be lower or higher, as well. The amplified RF signal is produced at the output 158 of peaking amplifier 152.

The RF output terminal 158 of the peaking amplifier 152 is coupled to the power combining node 180. According to an embodiment, the RF output terminal 158 of the peaking amplifier 152 and the combining node 180 are implemented with a common element.

The amplified carrier and peaking RF signals combine in phase at the combining node 180. The combining node 180 is electrically coupled to the RF output node 114 to provide the amplified and combined RF output signal to the RF output node 114. In an embodiment, an output impedance matching network 184 between the combining node 180 and the RF output node 114 functions to present proper load impedances to each of the carrier and peaking amplifier 132, 152. The resulting amplified RF output signal is produced at RF output node 114, to which an output load 190 (e.g., an antenna) is connected.

Amplifier 100 is configured so that the carrier amplifier path 130 provides amplification for relatively low-level input signals, and both amplification paths 130, 150 operate in combination to provide amplification for relatively high-level input signals. As described herein, both driver amplifiers 153 and 133 are implemented using SiGe transistors configured to exhibit gain expansion characteristics. These gain characteristics are configured to offset and linearize the non-linear gain characteristic of the power amplifiers implemented within main stage amplifiers 135 and 155, respectively. Additionally, and as described herein, the gain expansion characteristics of both driver amplifiers 133 and 153 may be adjust by changing values of variable feedback capacitances implemented within each of driver amplifiers 133 and 153. Accordingly, for a given amplifier 100 design, in which the amplifier 100's main amplifiers 135 and 155 have a particular input impedance and gain characteristics, the gain expansion characteristics of driver amplifiers 133 and 153 can be adjusted to increase efficiency and linearity of the overall amplifier 100.

Figure 2A:
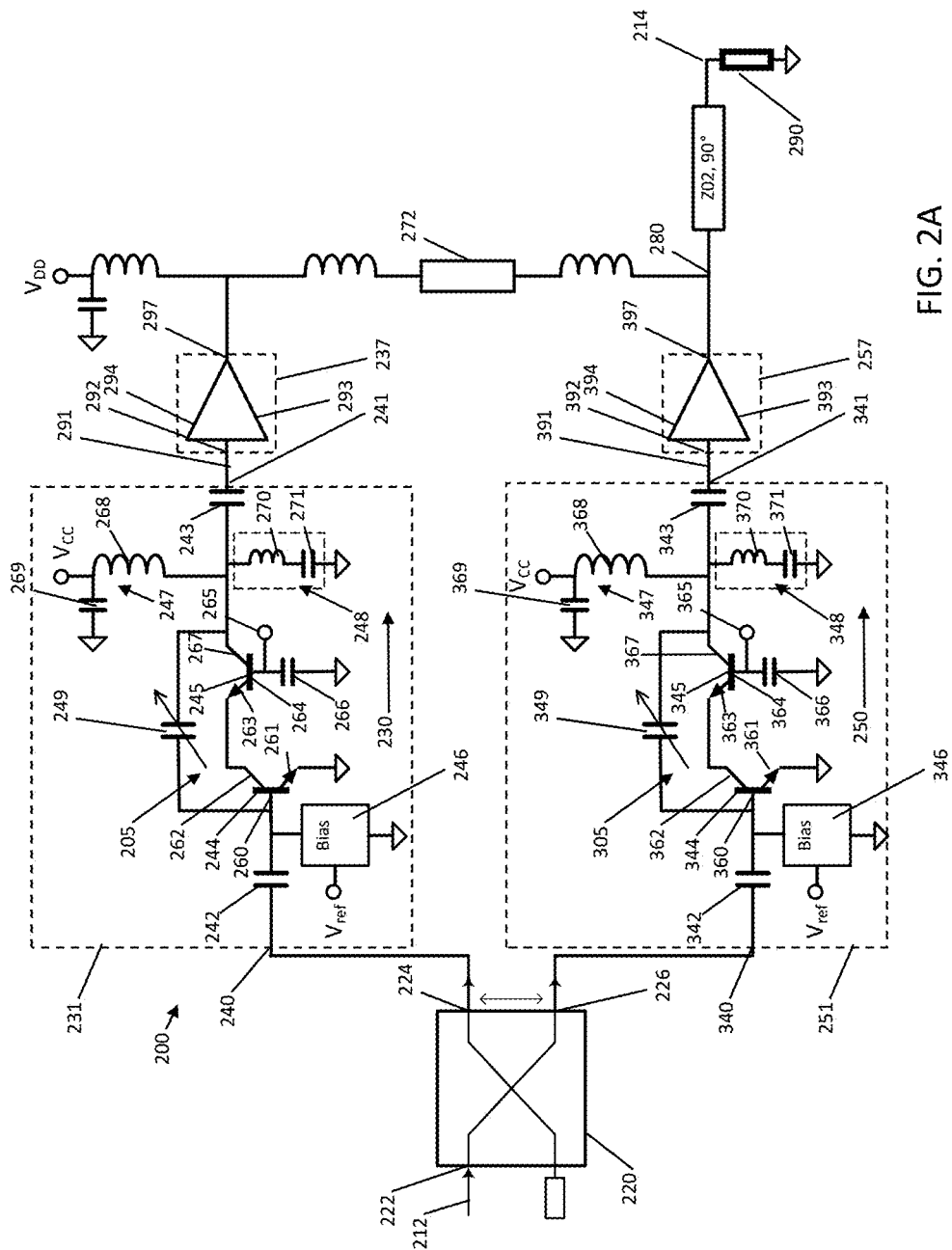
FIG. 2A is a circuit diagram depicting an embodiment of a Doherty amplifier, in accordance with an example embodiment.

FIG. 2A is a circuit diagram depicting an embodiment of a Doherty amplifier 200 (e.g., amplifier 100, FIG. 1). Doherty amplifier 200 includes an RF input node 212, an RF output node 214, a power splitter 220, a carrier amplifier path 230, a peaking amplifier path 250, a phase delay and impedance inversion element 272, and a combining node 280, in an embodiment.

RF input node 212 is configured to couple to an RF signal source (not illustrated), and the RF output node 214 is configured to couple to a load 290 (e.g., an antenna or other load). The RF signal source provides an input RF signal, which is an analog signal that includes spectral energy that typically is centered around one or more carrier frequencies. Fundamentally, the Doherty amplifier 200 is configured to amplify the input RF signal, and to produce an amplified RF signal at the RF output node 214.

The power splitter 220 has an input 222 and two outputs 224, 226, in an embodiment. The power splitter input 222 is coupled to the RF input node 212 to receive the input RF signal. The power splitter 220 is configured to divide the RF input signal received at input 222 into first and second RF signals (or carrier and peaking signals), which are provided to the carrier and peaking amplifier paths 230, 250 through outputs 224, 226. According to an embodiment, the power splitter 220 may include a phase shift element that is configured to impart a first phase shift (e.g., about a 90 degree phase shift) to the peaking signal before it is provided to output 226. Accordingly, at outputs 224 and 226, the carrier and peaking signals may be about 90 degrees out of phase from each other.

In some embodiments, power splitter 220 may be implemented with fixed-value, passive components. In other embodiments, power splitter 220 may be implemented with one or more controllable variable attenuators and/or variable phase shifters, which enable the power splitter 220 to attenuate and/or phase shift the carrier and peaking signals based on externally-provided control signals. Outputs 224, 226 of the power splitter 220 are connected to the carrier and peaking amplifier paths 230, 250, respectively.

Carrier amplifier path 230 is configured to amplify the carrier signal from output 224 of power splitter 220, and to provide the amplified carrier signal to the power combining node 280. Similarly, peaking amplifier path 250 is configured to amplify the peaking signal received from output 226 of power splitter 220, and to provide the amplified peaking signal to the power combining node 280, where the paths 230, 250 are designed so that the amplified carrier and peaking signals arrive in phase with each other at the power combining node 280.

According to an embodiment, the carrier amplifier path 230 includes a two-stage, amplifier with a SiGe driver amplifier stage and a GaN final amplifier stage, in accordance with an example embodiment. Carrier amplification path 230 includes a driver amplifier stage module as SiGe driver stage IC die 231 and a power amplifier module as GaN final amplifier stage IC die 237 (though IC die 231 could be implemented using other materials such as GaAs or InP and IC die 237 could be implemented in other III-V semiconductor substrates), which are electrically coupled together between output terminal 224 of power splitter 220 and RF combining node 280. A plurality of circuits, each including an arrangement of passive and/or active electrical components, may be integrated within the SiGe driver stage IC die 231 and the GaN final stage IC die 237.

More specifically, the SiGe driver stage IC die 231 may include a plurality of circuits integrated within a SiGe IC die. In an embodiment, the integrated circuitry of die 231 includes an input terminal 240, an output terminal 241, a first DC blocking/AC decoupling capacitor 242, a second DC blocking/AC decoupling capacitor 243, an interstage impedance matching circuit 247, power transistors 244, 245, a bias voltage control circuit 246, and an integrated portion of a harmonic control circuit 248, in an embodiment. According to an embodiment, a variable capacitance 249 is connected between a collector terminal 267 of transistor 245 and a base terminal 260 of transistor 244.

Transistors 244 and 245 are connected together in a cascode arrangement to form a driver amplifier 205 (e.g., driver amplifier stage 133) of carrier path 230. In the configuration shown in FIG. 2A, transistor 244 is connected in a common-emitter configuration, while transistor 245 is connected in a common-base configuration. The input signal received from input terminal 240 is supplied to base terminal 260 of transistor 244. Emitter terminal 261 of transistor 244 is connected to a ground reference terminal. Collector terminal 262 of transistor 244 is connected to emitter terminal 263 of transistor 245. Base terminal 264 of transistor 245 is coupled to bias voltage node 265. DC filter capacitor 266 is coupled between base terminal 264 of transistor 245 and a ground reference terminal. Collector terminal 267 of transistor 245 represents the output node of the driver amplifier and is connected to output terminal 241 of SiGe IC die 231 through capacitor 243.

In this configuration, transistors 244 and 245 are connected together in a cascode configuration. The cascode amplifier formed by the interconnection of transistors 244 and 245 exhibits gain expansion that, to some degree, offsets the non-linear gain characteristics of carrier main stage amplifier 293 enabling more linear operation of the carrier amplification path 230. Additionally, for applications in which carrier main amplifier 293 in combination with an output impedance matching network present a particular impedance to driver amplifier SiGe driver stage IC die 231, variable capacitor 249 can be adjusted to optimize the gain expansion characteristics of the amplifier of driver stage IC die 231 to improve linearity and efficiency of carrier amplifier path 230.

Variable capacitance 249 enables the feedback presented to the cascode amplifier to be adjusted, thereby controlling gain expansion of the driver amplifier stage implemented with SiGe die 231. The capacitance value of variable capacitor 249 may be controlled by a system controller (e.g., a processor or control circuit, not shown) configured to provide a control input to variable capacitor 249 to set a capacitance value thereof. In various embodiments, variable capacitor 249, based on the control input, may be configured to enter one of several different configurations in which each configuration is associated with a different capacitance value.

DC blocking/AC decoupling capacitor 242 has a first terminal electrically coupled to the input terminal 240, and a second terminal electrically coupled to the base terminal 260 of transistor 244. DC blocking/AC decoupling capacitor 242 may provide some impedance transformation, but with a primary functionality of blocking the driver stage gate bias voltage 246 from the input terminal 240. In this configuration, a bias current (controlled by the value Vref supplied to gate bias voltage 246) may be utilized to control small-signal gain of driver amplifier 205, thereby decoupling the small-signal gain and the expansion gain curve of driver amplifier 205.

The integrated portion of the interstage impedance matching circuit 247 is electrically coupled at a node between the collector terminal 267 of transistor 245, and the output terminal 241. The integrated portion of the interstage impedance matching circuit includes inductor 268 coupled between a Vcc node and collector terminal 267 of transistor 245, and DC blocking/AC decoupling capacitor 243. Blocking capacitor 269 is connected between inductor 268 and a ground reference terminal.

DC blocking/AC decoupling capacitor 243 may provide some impedance transformation, but with a primary functionality of blocking the collector bias voltage, Vcc from a gate bias voltage for the power transistor of the GaN final stage IC die 237.

SiGe driver stage IC die 231 also may include an integrated portion of a harmonic control circuit 248. Harmonic control circuit 248 includes an inductor 270 coupled in series with capacitor 271 between collector terminal 267 of transistor 245 and a ground reference terminal. Harmonic control circuit 248 provides a low impedance path to a ground node for second order harmonic signals generated by amplifier 205 at collector terminal 267 of transistor 245. As such, harmonic control circuit 248 can operate to improve the linearity characteristic (AMPM) of driver amplifier 205.

SiGe driver stage IC die 231 is electrically coupled to the GaN final stage IC die 237. In an embodiment, the SiGe IC die 231 is electrically coupled to the GaN IC die 237 through connection 291 between the output terminal 241 of SiGe IC die 231 and an input terminal 292 of the GaN IC die 237. For example, the connection 291 may include an inductive connection, such as a wirebond array, or may include another type of DC-coupled connection (e.g., including a microstrip line, a printed coil, a parallel-coupled resistor/capacitor circuit, and so on).

The power transistor 293 is the primary amplification component of the GaN final stage IC die 237. In an embodiment, power transistor 293 includes a FET with a gate terminal 294, a drain terminal, and a source terminal. The input terminal 292 is coupled to the gate terminal 294 of the GaN transistor 293. The drain terminal 294 of the GaN transistor 293 is coupled to the output terminal 297, and the source terminal of the GaN transistor 293 is electrically coupled to a ground node. The output terminal 297 is electrically coupled to combining node 280 through impedance inversion element 272. In embodiments, the gate terminal 294 of GaN transistor 293 may be coupled to a harmonic termination circuit (not shown) that is configured to terminate second order harmonic signals at the gate terminal 294 (i.e., signals having energy at the second harmonic, $2f_0$, of the center operating frequency, $f_0$, of GaN transistor 293). Such harmonic termination circuit may be incorporated into driver stage IC die 231 in which case an electrical interconnect (e.g., a wirebond array or a conductive trace) may electrically connect gate terminal 294 of GaN transistor 293 to the harmonic termination circuit via a terminal on the driver stage IC die 231.

According to an embodiment, the peaking amplifier path 250 includes a two-stage amplifier with a SiGe driver amplifier stage and a GaN final amplifier stage. Peaking amplification path 250 includes a driver amplifier stage module as SiGe driver stage IC die 251 and a power amplifier module as GaN final amplifier stage IC die 257 (though IC die 251 could be implemented using other materials such as GaAs or InP and IC die 257 could be implemented in other III-V semiconductor substrates), which are electrically coupled together between output terminal 226 of power splitter 220 and RF combining node 280. A plurality of circuits, each including an arrangement of passive and/or active electrical components, are integrated within the SiGe driver stage IC die 251 and the GaN final stage IC die 257.

More specifically, the SiGe driver stage IC die 251 includes a plurality of circuits integrated within a SiGe IC die. In an embodiment, the integrated circuitry of die 251 includes an input terminal 340, an output terminal 341, a first DC blocking/AC decoupling capacitor 342, a second DC blocking/AC decoupling capacitor 343, an interstage impedance matching circuit 347, power transistors 344, 345, a bias voltage control circuit 346, and an integrated portion of a harmonic control circuit 348, in an embodiment. According to an embodiment, variable capacitance 349 is connected between a collector terminal 367 of transistor 345 and a base terminal 360 of transistor 344.

Transistors 344 and 345 are connected together in a cascode arrangement to form a driver amplifier 305 (e.g., driver amplifier stage 153) of peaking path 250. In the configuration shown in FIG. 2A, transistor 344 is connected in a common-emitter configuration and transistor 345 is connected in a common-base configuration. The input signal received from input terminal 340 is supplied to base terminal 360 of transistor 344. Emitter terminal 361 of transistor 344 is connected to a ground reference terminal. Collector terminal 362 of transistor 344 is connected to emitter terminal 363 of transistor 345. Base terminal 364 of transistor 345 is coupled to bias voltage node 365. DC filter capacitor 366 is coupled between base terminal 364 of transistor 345 and a ground reference terminal. Collector terminal 367 of transistor 345 represents the output node of the driver amplifier and is connected to output terminal 341 of SiGe IC die 251 through capacitor 343.

In this configuration, transistors 344 and 345 are connected together in a cascode configuration. The cascode amplifier formed by the interconnection of transistors 344 and 345 exhibits gain expansion that can be configured to enable optimized turn-on characteristics of the peaking amplification path 250 (and, specifically, peaking main stage amplifier 393) enabling improved Doherty amplifier 200 efficiency in back-off and to control the gain inflection point of Doherty amplifier 200. Additionally, for applications in which peaking main amplifier 393 in combination with an output impedance matching network presents a particular impedance to driver amplifier SiGe driver stage IC die 251, variable capacitor 349 can be adjusted to optimize the gain expansion characteristics of the amplifier of driver stage IC die 251 to improve linearity and efficiency of the overall Doherty amplifier 200.

Variable capacitance 349 enables the feedback presented to the cascode amplifier to be adjusted, thereby controlling gain offset and adjusting the gain slope of the overall peaking amplification path 250. The capacitance value of variable capacitor 349 may be controlled by a system controller (e.g., a processor or control circuit, not shown) configured to provide a control input to variable capacitor 349 to set a value thereof. In various embodiments, variable capacitor 349, based on the control input, may be configured to enter one of several different configurations in which each configuration is associated with a different capacitance value.

DC blocking/AC decoupling capacitor 342 has a first terminal electrically coupled to the input terminal 340, and a second terminal electrically coupled to the base terminal 360 of transistor 344. DC blocking/AC decoupling capacitor 342 may provide some impedance transformation, but with a primary functionality of blocking the driver stage gate bias voltage 346 from the input terminal 340. In this configuration, a bias current (controlled by the value Vref supplied to gate bias voltage 346) may be utilized to control small-signal gain of driver amplifier 305, thereby decoupling the small-signal gain and the expansion gain curve of driver amplifier 305.

The integrated portion of the interstage impedance matching circuit 347 is electrically coupled between the collector terminal 367 of transistor 345, and output terminal 341. The integrated portion of the interstage impedance matching circuit includes inductor 368 coupled between a Vcc node and collector terminal 367 of transistor 345, and DC blocking/AC decoupling capacitor 343. Blocking capacitor 369 is connected between inductor 368 and a ground reference terminal.

DC blocking/AC decoupling capacitor 343 may provide some impedance transformation, but with a primary functionality of blocking the collector bias voltage, Vcc from a gate bias voltage for the power transistor of the GaN final stage IC die 257.

SiGe driver stage IC die 251 also may include an integrated portion of a harmonic control circuit 348. Harmonic control circuit 348 includes an inductor 370 coupled in series with capacitor 371 between collector terminal 367 of transistor 345 and a ground reference terminal. Harmonic control circuit 348 provides a low impedance path to a ground node for second order harmonic signals generated by amplifier 305 at collector terminal 367 of transistor 345. As such, harmonic control circuit 348 can operate to improve the linearity characteristic (AMPM) of driver amplifier 305.

SiGe driver stage IC die 251 is electrically coupled to the GaN final stage IC die 257. In an embodiment, the SiGe IC die 251 is electrically coupled to the GaN IC die 257 through connection 391 between the output terminal 341 of SiGe IC die 251 and an input terminal 392 of the GaN IC die 257. For example, the connection 391 may include an inductive connection, such as a wirebond array, or may include another type of DC-coupled connection (e.g., including a microstrip line, a printed coil, a parallel-coupled resistor/capacitor circuit, and so on).

The GaN transistor 393 is the primary amplification component of the GaN final stage IC die 257. In an embodiment, power transistor 393 includes a FET with a gate terminal 394, a drain terminal, and a source terminal. The input terminal 392 is coupled to the gate terminal 394 of the GaN transistor 393. In embodiments, the gate terminal 394 of GaN transistor 393 may be coupled to a harmonic termination circuit (not shown) that is configured to terminate second order harmonic signals at the gate terminal 394 (i.e., signals having energy at the second harmonic, $2f_0$, of the center operating frequency, $f_0$, of GaN transistor 393). Such harmonic termination circuit may be incorporated into driver stage IC die 251 in which case an electrical interconnect (e.g., a wirebond array or a conductive trace) may electrically connect gate terminal 394 of GaN transistor 393 to the harmonic termination circuit via a terminal on the driver stage IC die 251.

The drain terminal of GaN transistor 393 is coupled to the output terminal 397, and the source terminal of GaN transistor 393 is electrically coupled to a ground node. The output terminal 397 is electrically coupled to combining node 280.

Combining node 280 is coupled to RF output node 214, which may, in turn, be connected to load 290.

Figure 2B:
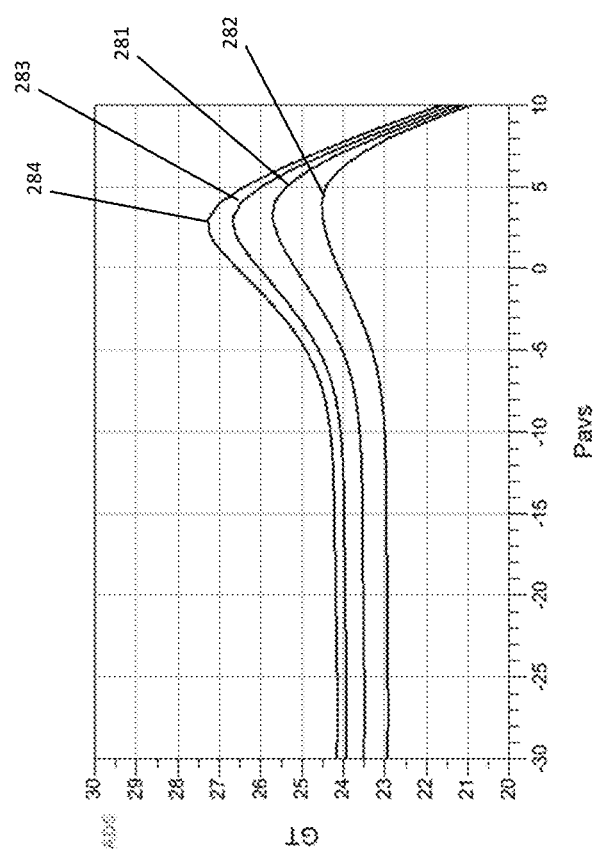
FIG. 2B is a chart illustrating gain curves for a driver amplifier that includes a variable feedback capacitance set to different capacitance values.

As discussed herein, the capacitance values of variable capacitors 249 and 349 can be adjusted to control a gain expansion characteristic of the driver amplifiers 205, 305 of SiGe driver stage IC dies 231 and 251, respectively. To illustrate, FIG. 2B shows example gain curves for a driver amplifier (e.g., the driver amplifier 205 of IC die 231) with a variable feedback capacitance set to different capacitance values. As shown in FIG. 2B an initial curve 281 show the gain expansion characteristics of a SiGe HBT cascode driver amplifier 205 with a nominal capacitance value. The nominal capacitance value may represent a typical capacitance value for the feedback capacitor that generates reasonable overall amplifier linearity with a reasonable efficiency. The nominal capacitance value can be based on amplifier behavior, given a nominal process corner of the SiGe and GaN technology (and possibly laminate). The maximum and minimum ranges for the capacitance values of variable capacitors 249 and 349 could, in various implementations, be derived from maximum process variations for the fabrications processes of driver stage IC dies 231, 251, final stage amplifier dies 237, 257, other components of Doherty amplifier 200, and combinations thereof. Curve 282, in turn, shows the gain expansion characteristics of the SiGe HBT cascode driver amplifier 205 with feedback capacitance value that is equal to the nominal capacitance value multiplied by two. Curve 283 shows the gain expansion characteristics of the SiGe HBT cascode driver amplifier 205 with feedback capacitance value that is equal to the nominal capacitance value divided by 1.5. And curve 284 shows the gain expansion characteristics of the SiGe HBT cascode driver amplifier 205 with feedback capacitance value that is equal to the nominal capacitance value divided by two. As illustrated in FIG. 2B, the gain characteristics of the driver amplifier 205, 305 can be adjusted by modifying the capacitance value of the feedback capacitor. Furthermore, the gain curves show gain expansion, which is due to the HBT cascode driver amplifiers responding to the varying load at the collector side in combination with changes to the amount of feedback across the driver amplifier. Less feedback results in high driver amplifier output impedance and the more the driver amplifier reacts to changes in the collector load. More feedback results in low driver amplifier output impedance with the driver amplifier reacting less to change in collector load. This gain expansion characteristic can provide for a more linear overall amplifier response by providing a sharper turn-on characteristics of the amplifier's peaking main amplifier. This sharp turn-on characteristic may also increase the overall efficiency of such an amplifier by reducing power consumption by the peaking path at back-off power levels.

FIG. 3A is a schematic diagram of a variable capacitor network 300a that may be incorporated into a driver amplifier (e.g., as variable capacitance 249 and 349 of FIG. 2A), in accordance with an example embodiment. Network 300a includes an input node 330a, an output node 332a, and a plurality, N, of discrete capacitors 301a-304a coupled in series with each other between the input and output nodes 330a, 332a, where N may be an integer between 2 and 10, or more. In addition, network 300a includes a plurality, N, of bypass switches 311a-314a, where each switch 311a-314a is coupled in parallel across the terminals of one of the capacitors 301a-304a. Switches 311a-314a may be implemented as transistors, mechanical relays or mechanical switches, for example. The electrically conductive state of each switch 311a-314a (i.e., open or closed) is controlled through control signals 321a-324a from a system controller.

For each parallel capacitor/switch combination, substantially all voltage accumulates across the capacitor when the capacitor's corresponding switch is in an open or non-conductive state, and substantially all current flows through the switch when the switch is in a closed or conductive state thereby bypassing the capacitor. For example, when all switches 311a-314a are open, as illustrated in FIG. 3A, substantially all current flowing between input and output nodes 330a, 332a flows through the series of capacitors 301a-304a. This configuration represents the maximum capacitance state of the network 300a (i.e., the state of network 300a in which a maximum capacitance value is present between input and output nodes 330a, 332a). Conversely, when all switches 311a-314a are closed, substantially all current flowing between input and output nodes 330a, 332a bypasses the capacitors 301a-304a and flows instead through the switches 311a-314a and the conductive interconnections between nodes 330a, 332a and switches 311a-314a. This configuration represents the minimum capacitance state of the network 300a (i.e., the state of network 300a in which a minimum capacitance value is present between input and output nodes 330a, 332a).

Starting from the maximum capacitance state in which all switches 311a-314a are open, the system controller may provide control signals 321a-324a that result in the closure of any combination of switches 311a-314a in order to reduce the capacitance of the network 300a by bypassing corresponding combinations of capacitors 301a-304a. In one embodiment, each capacitance 301a-304a has substantially the same capacitance value, referred to herein as a normalized value of C. The state of the network 300a may be configured to have any of N+1 values of capacitance.

In an alternate embodiment, the capacitors 301a-304a may have different values from each other. For example, moving from the input node 330a toward the output node 332a, the first capacitor 301a may have a normalized capacitance value of C, and each subsequent capacitor 302a-304a in the series may have a larger or smaller capacitance value. For example, each subsequent capacitor 302a-304a may have a capacitance value that is a multiple (e.g., about twice) the capacitance value of the nearest downstream capacitor 301a-303a, although the difference may not necessarily be an integer multiple. In such an embodiment, the state of the network 300a may be configured to have any of $2^N$ values of capacitance. For example, when N=4 and each capacitor 301a-304a has a different value, the network 300a may be configured to have any of 16 values of capacitance. Although the above example embodiment specifies that the number of switched capacitors in the network 300a equals four, and that each capacitor 301a-304a has a value that is some multiple of a value of C, alternate embodiments of variable capacitance networks may have more or fewer than four capacitors, different relative values for the capacitors, a different number of possible network states, and/or a different configuration of capacitors (e.g., differently connected sets of parallel and/or series-coupled capacitors).

FIG. 3B is a schematic diagram of a variable capacitor network 300b that may be incorporated into a driver amplifier (e.g., as variable capacitance 249 and 349 of FIG. 2A), in accordance with an example embodiment. Network 300b includes an input node 330b, an output node 332b, and a plurality, N, of discrete capacitors 301b-304b coupled in parallel with each other between the input and output nodes 330b, 332b, where N may be an integer between 2 and 10, or more. In addition, network 300b includes a plurality, N, of bypass switches 311b-314b, where each switch 311b-314b is coupled in series to one of the capacitors 301b-304b. Switches 311b-314b may be implemented as transistors, mechanical relays or mechanical switches, for example. The electrically conductive state of each switch 311b-314b (i.e., open or closed) is controlled through control signals 321b-324b from a system controller.

For each series capacitor/switch combination, substantially all voltage accumulates across the capacitor when the capacitor's corresponding switch is in a closed or conductive state, and no voltage accumulates across the capacitor when the capacitor's corresponding switch is in an open of non-conductive state, thereby bypassing the capacitor. For example, when all switches 311b-314b are closed, as illustrated in FIG. 3B, substantially all voltage across input and output nodes 330b, 332b accumulates across capacitors 301b-304b. This configuration represents the maximum capacitance state of the network 300b (i.e., the state of network 300b in which a maximum capacitance value is present between input and output nodes 330b, 332b).

Starting from the maximum capacitance state in which all switches 311b-314b are closed, the system controller may provide control signals 321b-324b that result in the opening of any combination of switches 311b-314b in order to reduce the capacitance of the network 300b by bypassing corresponding combinations of capacitors 301b-304b. In one embodiment, each capacitance 301b-304b has substantially the same capacitance value, referred to herein as a normalized value of C. In such an embodiment, the maximum capacitance value for the network 300b (i.e., when all switches 311b-314b are in a closed state) would be about N×C. When any n switches are in a closed state, the capacitance value for the network 300b would be about (N−n)×C. In such an embodiment, the state of the network 300b may be configured to have any of N+1 values of capacitance.

In an alternate embodiment, the capacitors 301b-304b may have different values from each other. For example, moving from the left to right across the circuit diagram of FIG. 3B, the first capacitor 301b may have a normalized capacitance value of C, and each subsequent capacitor 302b-304b in the series may have a larger or smaller capacitance value. For example, each subsequent capacitor 302b-304b may have a capacitance value that is a multiple (e.g., about twice) the capacitance value of the nearest preceding capacitor 301b-303b, although the difference may not necessarily be an integer multiple. In such an embodiment, the state of the network 300b may be configured to have any of $2^N$ values of capacitance. For example, when N=4 and each capacitor 301b-304b has a different value, the network 300b may be configured to have any of 16 values of capacitance.

Although the above example embodiment specifies that the number of switched capacitors in the network 300b equals four, and that each capacitor 301b-304b has a value that is some multiple of a value of C, alternate embodiments of variable capacitance networks may have more or fewer than four capacitors, different relative values for the capacitors, a different number of possible network states, and/or a different configuration of capacitors (e.g., differently connected sets of parallel and/or series-coupled capacitors).

When variable capacitor networks 300a or 300b are incorporated into a driver amplifier (e.g., as variable capacitance 249 and 349 of FIG. 2A), in accordance with an example embodiment, the variable capacitor network 300a or 300b may be configured to exhibit a minimum capacitance of 50 femtoFarads (fF) (e.g., in FIG. 3A when only a single switch 311a-314a is open or in FIG. 3B when only a single switch 311*b*-314*b* is closed) to a maximum capacitance of 200 fF (e.g., in FIG. 3A when all switches 311*a*-314*a* are open or in FIG. 3B when all switches 311*b*-314*b* are closed). In that case, variable capacitance networks 300*a* and 300*b* may exhibit nominal capacitance values or about 100 fF. In other embodiments, however, variable capacitor networks 300*a* and 300*b* may be configured to exhibit different maximum and minimum capacitances.

As illustrated in FIG. 2A, in an embodiment of a Doherty amplifier, SiGe driver stage amplifiers may be implemented for each of the carrier and peaking paths of the Doherty amplifier in separate IC die (e.g., SiGe driver stage IC dies 231 and 251 of FIG. 2A). Alternatively, both the carrier and peaking driver amplifiers maybe incorporated into a single IC die.

Figure 4:
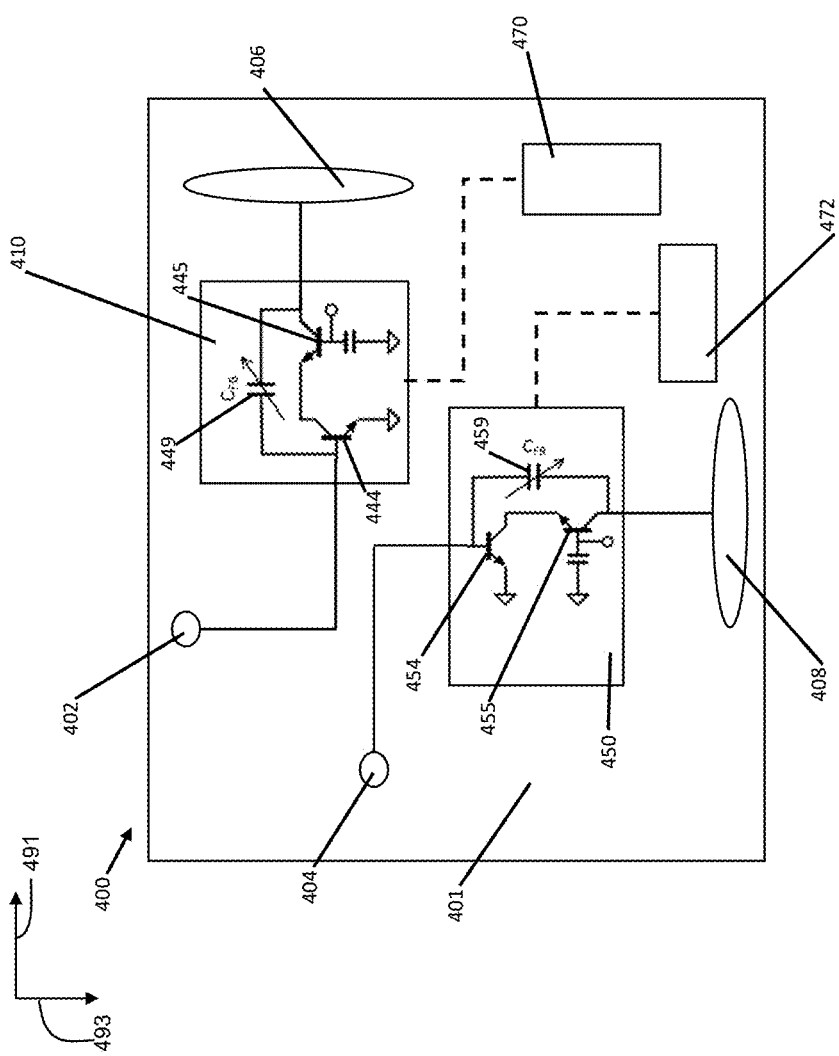
FIG. 4 is a top view of a layout of a SiGe driver stage IC die that includes first and second driver stage amplifiers, where the first driver stage amplifier may form part of a carrier path in a Doherty amplifier and the second driver stage amplifier may form part of a peaking path in the Doherty amplifier.

To illustrate, FIG. 4 is a block diagram depicting an example driver stage IC die 400 that includes first and second driver stage amplifiers, where the first driver stage amplifier may form part of a carrier path in a Doherty amplifier and the second driver stage amplifier may form part of a peaking path in the Doherty amplifier.

SiGe driver stage IC die 400 includes a SiGe substrate 401 (though substrate 401 could be implemented using other materials such as GaAs or InP) and a plurality of circuits integrated within the SiGe driver stage IC die 400. In an embodiment, the integrated circuitry of die 400 includes input terminal 402 (e.g., input terminal 240, FIG. 2A), input terminal 404 (e.g., input terminal 340, FIG. 2A), output terminal 406 (e.g., output terminal 241, FIG. 2A), output terminal 408 (e.g., output terminal 341, FIG. 2A), and harmonic control circuits 470 and 472.

SiGe IC die 400 includes carrier driver amplifier 410, which includes a cascode amplifier including first and second transistors 444, 445 (e.g., amplifier 205 of FIG. 2A) and a feedback variable capacitor 449 (e.g., variable capacitor 249 of FIG. 2A). The transistors 444, 445 of carrier driver amplifier 410 may include two HBT transistors implemented in a cascode arrangement in which an input signal received from input terminal 402 is supplied to a base terminal of transistor 444. The emitter terminal of transistor 444 is connected to a ground reference terminal. The collector terminal of transistor 444 is connected to the emitter terminal of transistor 445. The base terminal of transistor 445 is coupled to a bias voltage node. A DC filter capacitor is coupled between the base terminal of transistor 445 and a ground reference terminal. The collector terminal of transistor 445 represents the output node of the driver amplifier 410 and is connected to output terminal 406 of SiGe IC die 400.

SiGe IC die 400 includes peaking driver amplifier 450, which includes a cascode amplifier including first and second transistors 454, 455 (e.g., amplifier 305 of FIG. 2A) and a feedback variable capacitor 459 (e.g., variable capacitor 349 of FIG. 2A). The transistors 454, 455 of peaking driver amplifier 450 may include two HBT transistors implemented in a cascode arrangement in which an input signal received from input terminal 404 is supplied to a base terminal of transistor 454. The emitter terminal of transistor 454 is connected to a ground reference terminal. The collector terminal of transistor 454 is connected to the emitter terminal of transistor 455. The base terminal of transistor 455 is coupled to a bias voltage node. A DC filter capacitor is coupled between the base terminal of transistor 455 and a ground reference terminal. The collector terminal of transistor 455 represents the output node of the carrier driver amplifier 410 and is connected to output terminal 408 of SiGe IC die 400.

The SiGe driver stage IC die 400 also includes an integrated portion of harmonic control circuit 470 (e.g., harmonic control circuit 248, FIG. 2A) and harmonic control circuit 472 (e.g., harmonic control circuit 348, FIG. 2A). In an embodiment, harmonic control circuit 470 is electrically coupled to carrier driver amplifier 410 (i.e., at a collector terminal of transistor 445) to provide a low impedance path to the ground node for signal energy at the second harmonic, $2f_0$, of the center operating frequency, $f_0$, of the carrier driver amplifier 410.

In an embodiment, harmonic control circuit 472 is electrically coupled to peaking driver amplifier 450 (i.e., at a collector terminal of transistor 455) to provide a low impedance path to the ground node for signal energy at the second harmonic, $2f_0$, of the center operating frequency, $f_0$, of peaking driver amplifier 450.

Within IC die 400, carrier driver amplifier 410 is rotationally offset from peaking driver amplifier 450 by 90 degrees so that a direction of travel of signals passing through carrier driver amplifier 410 (e.g., in direction 491) have an angular separation of 90 degrees from a direction of travel of signals passing through peaking driver amplifier 450 (e.g., in direction 493). Such rotational offset can minimize or reduce electromagnetic coupling between signals traveling through carrier driver amplifier 410 and peaking driver amplifier 450. This may enable reduction of the overall size of die 400 as such rotational offset may allow carrier driver amplifier 410 and peaking driver amplifier 450 to be in closer proximity to one another than other designs in which carrier and peaking driver amplifiers may be parallel to one another.

If carrier driver amplifier 410 and peaking driver amplifier 450 were to be implemented using other types of technologies and devices (e.g., MOSFETs implemented within a Si substrate), the amplifiers' construction may not allow for such rotational offset as the transistors must all be arranged within the same substrate along the same axis. MOSFET technologies may not allow for such rotational offset. Accordingly, in die 400, the HBT configuration of the transistors making up carrier driver amplifier 410 and peaking driver amplifier 450 allows for that rotational offset.

Figure 5:
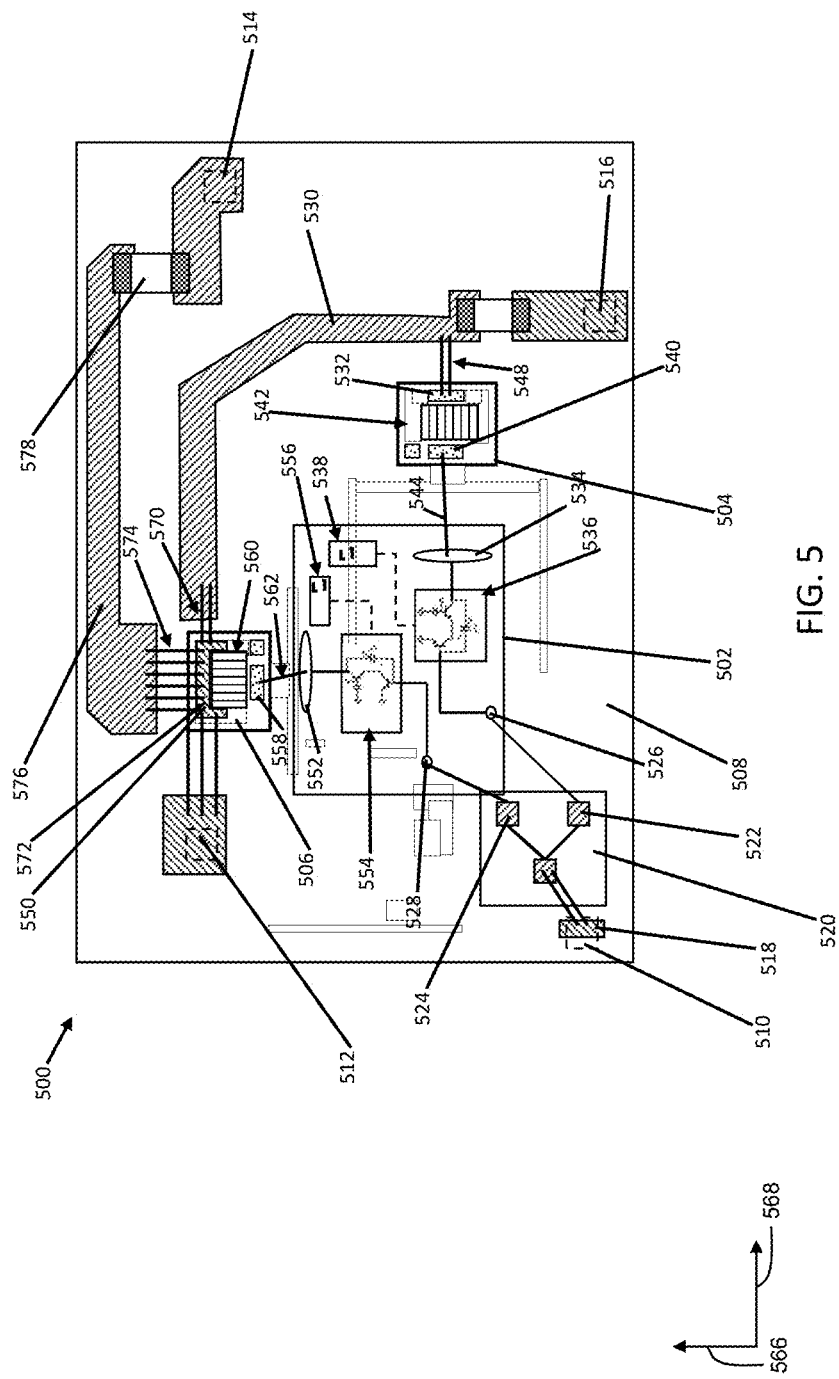
FIG. 5 is a top view of an example of a radio frequency (RF) amplifier device that includes a Doherty power amplifier with a main amplification path and a peaking amplification path, in accordance with an example embodiment.

FIG. 5 is a top view of an example of an RF amplifier device 500 that includes a Doherty power amplifier with a main amplification path and a peaking amplification path. The main amplification path includes a driver stage amplifier on SiGe driver stage IC die 502 and a GaN final stage IC die 504 (though IC die 504 could be implemented in other III-V semiconductor substrates). The peaking amplification path also includes a driver stage amplifier on SiGe driver stage IC die 502 and a GaN final stage IC die 506 (though IC die 506 could be implemented in other III-V semiconductor substrates), in accordance with an example embodiment. RF amplifier device 500 will alternatively be referred to below as a "Doherty power amplifier module. In the illustration of FIG. 5, SiGe driver stage IC die 502 has been flipped and mounted to a surface of substrate 508. As such, the configuration of SiGe driver stage IC die 502 is inverted when compared to the die 400 of FIG. 4.

The Doherty power amplifier device 500 includes a substrate in the form of a multiple-layer PCB 508, which includes at least one dielectric layer (e.g., formed from FR-4, ceramic, or other PCB dielectric materials), and two or more conductive layers. In an embodiment, the conductive layer on the top surface of the PCB 508 is a patterned conductive layer. Various conductive features (e.g., conductive pads and traces) formed from portions of the top patterned conductive layer may serve as attachment points for dies 502, 504, 506 and other discrete components, and also may provide electrical connectivity between the dies 502, 504, 506 and the other discrete components. Another conductive layer may serve as a ground reference plane. In some embodiments, one or more additional patterned conductive layers may provide conductive connections between the dies 502, 504, 506, the discrete components, and the ground reference plane. According to an embodiment, a bottom conductive layer is utilized to provide externally-accessible, conductive landing pads, where the locations of some example landing pads 510, 512, 514, 516 are indicated with dashed boxes in FIG. 5. These landing pads (among others, not illustrated) enable surface mounting of the Doherty power amplifier device 500 onto a separate substrate (not illustrated) that provides electrical connectivity to other portions of an RF system. Landing pads 512 and 516, for example, may be utilized supply drain bias voltages to power transistors 560 and 542, respectively. Although device 500 is depicted as a land grid array (LGA) module, device 500 alternatively may be packaged as a pin grid array module, a quad flat no-leads (QFN) module, or another type of package.

The Doherty power amplifier device 500 further includes an RF signal input terminal 518, a power splitter 520, a two-stage, main amplifier that includes a driver amplifier on SiGe driver stage IC die 502 and GaN final stage IC die 504, a two-stage peaking amplifier that includes a driver amplifier on SiGe driver stage IC die 502 and GaN final stage IC die 506, various phase shift and impedance matching elements, and a combiner. A conductive landing pad 510 exposed at the bottom surface of the PCB 508 functions as the RF signal input terminal for the device 500. Through one or more conductive structures (e.g., vias, traces, and/or wirebonds), the landing pad 510 is electrically coupled to an input 518 to the power splitter 520.

The power splitter 520, which is coupled to the mounting surface of the PCB 508, may include one or more discrete die and/or components, although it is represented in FIG. 5 as a single element. The power splitter 520 includes an input terminal 518 and two output terminals 522, 524. The input terminal 518 is electrically coupled through one or more conductive structures (e.g., vias, traces, and/or wirebonds) to the landing pad 510 to receive an input RF signal. The output terminals 522, 524 of the power splitter 520 are electrically coupled through one or more conductive structures (e.g., solder bumps, vias, traces, and/or wirebonds) to inputs 526, 528 for the main and peaking amplifiers, respectively.

The power splitter 520 is configured to split the power of the input RF signal received through the landing pad 510 into first and second RF signals, which are produced at the output terminals 522, 524 of the power splitter 520. In addition, the power splitter 520 may include one or more phase shift elements configured to impart about a 90 degree phase difference between the RF signals provided at the output terminals 522, 524. The first and second RF signals produced at the output terminals 522, 524 of the power splitter 520 may have equal or unequal power.

The first output 522 of the power splitter is electrically coupled to a main amplifier path (i.e., to the main amplifier), and the second output 524 of the power splitter is electrically coupled to a peaking amplifier path (i.e., to the peaking amplifier). In the illustrated embodiment, the RF signal produced at the second power splitter output is delayed by about 90 degrees from the RF signal produced at the first power splitter output. In other words, the RF signal provided to the peaking amplifier path is delayed by about 90 degrees from the RF signal provided to the main amplifier path.

The first RF signal produced by the power splitter 520 is amplified through the main amplifier path, which includes a driver amplifier stage on the SiGe driver stage IC die 502, GaN final stage IC die 504, and phase shift element 530. The second RF signal produced by the power splitter 520 at output terminal 524 is amplified through the peaking amplifier path, which includes a driver amplifier stage on the SiGe driver stage IC die 502, and GaN final stage IC die 506.

The main driver amplifier stage of driver stage IC die 502 and the carrier GaN final stage IC die 504 of the main amplifier path are electrically coupled together in a cascade arrangement between an input terminal 526 of the SiGe driver stage IC die 502 (corresponding to a main amplifier input) and an output terminal 532 of the GaN final stage IC die 504 (corresponding to a carrier amplifier output). The SiGe driver stage IC die 502 includes a plurality of integrated circuits. In an embodiment, the integrated circuitry of die 502 includes input terminal 526, output terminal 534, main driver amplifier 536, and an integrated portion of a harmonic control circuit 538, in an embodiment. The various circuits and components within the SiGe driver stage IC die 502 may be configured and electrically coupled together as described previously in conjunction with FIG. 4.

The first output 522 of the power divider 520 is electrically coupled to the input terminal 526 of the SiGe driver stage IC die 502 through various conductive traces, circuitry, and solder bumps or other types of electrical connections.

The GaN final stage IC die 504 includes a plurality of integrated circuits. In an embodiment, the integrated circuitry of die 504 includes an input terminal 540, an output terminal 532, and a GaN power transistor 542. The various circuits and components within the GaN final stage IC die 542 may be configured and electrically coupled together as described previously in conjunction with FIGS. 1 and 2.

The output terminal 534 of the SiGe driver stage IC die 502 is electrically coupled to the input terminal 540 of the GaN final stage IC die 504 through electrical connection 544 (e.g., conductive traces) or another type of electrical connection. The input terminal 540 is electrically coupled to the gate of the GaN power transistor 542. In embodiments, the gate of the GaN power transistor 542 can be electrically coupled through electrical connection (e.g., conductive traces or wirebond array) to a harmonic control circuit. Such harmonic control circuit may be incorporated at least in part into SiGe driver stage IC die 502 or may be implemented within a separate component or collection of components of device 500.

The amplified first RF signal is produced at the output terminal 532 of the GaN final stage IC die 504. According to an embodiment, the output terminal 532 is electrically coupled (e.g., through wirebonds 548 or another type of electrical connection) to phase shift element 530. According to an embodiment, phase shift element 530 has a first end that is proximate to the output terminal 532 of the GaN final stage IC die 504, and a second end that is proximate to the output terminal 550 of the GaN final stage IC die 506. For example, the phase shift element 530 may be implemented with a lambda/4 ($\lambda/4$) transmission line (e.g., a microstrip transmission line with a 90-degree electrical length) that extends between its first and second ends. The phase shift element 530 may impart about a 90 degree relative phase shift to the amplified first RF signal as the signal travels from the phase shift element's first end to its second end.

As mentioned above, the second RF signal produced by the power splitter 520 is amplified through the peaking amplifier path, which includes the SiGe driver stage IC die 502 and GaN final stage IC die 506. The SiGe driver stage IC die 502 and the GaN final stage IC die 506 of the peaking amplifier path are electrically coupled together in a cascade arrangement between an input terminal 528 of the SiGe driver stage IC die 502 (corresponding to a peaking amplifier input) and an output terminal 550 of the GaN final stage IC die 506 (corresponding to a peaking amplifier output). The SiGe driver stage IC die 502 includes input terminal 528, an output terminal 552, peaking driver amplifier 554, and an integrated portion of a harmonic control circuit 556, in an embodiment. The various circuits and components within SiGe driver stage IC die 502 may be configured and electrically coupled together as described previously in conjunction with FIGS. 1 and 2.

The second output of the power divider 520 is electrically coupled to the input terminal 528 of the SiGe driver stage IC die 502 through various conductive traces, circuitry, and/or wirebonds or another type of electrical connection.

The GaN final stage IC die 506 includes a plurality of integrated circuits. In an embodiment, the integrated circuitry of die 506 includes an input terminal 558, an output terminal 550, and a GaN power transistor 560. The various circuits and components within the GaN final stage IC die 506 may be configured and electrically coupled together as described previously in conjunction with FIGS. 1 and 2.

The output terminal 552 of the SiGe driver stage IC die 502 is electrically coupled to the input terminal 558 of the GaN final stage IC die 506 through electrical connection 562 (e.g., conductive trace) or another type of electrical connection. The input terminal 558 is electrically coupled to the gate of the GaN power transistor 560. In embodiments, the gate of the GaN power transistor 560 can be electrically coupled through electrical connection (e.g., conductive traces or wirebond array) to a harmonic control circuit. Such harmonic control circuit may be incorporated at least in part into SiGe driver stage IC die 502 or may be implemented within a separate component or collection of components of device 500. The peaking signal path through the cascade-coupled peaking amplifier dies 502 and 506 is in a direction indicated by arrow 566. Conversely, the carrier signal path through the cascade-coupled carrier amplifier dies 502 and 504 is in a direction indicated by arrow 568. As such, the signal paths are orthogonal in the embodiment of FIG. 5. Such orthogonal orientation may significantly reduce coupling between signals carried through and amplified by the main and peaking amplifier paths.

In any event, the amplified second RF signal is produced by the GaN final stage IC die 506 at the RF output terminal 550. According to an embodiment, the RF output terminal 550 is electrically coupled (e.g., through wirebonds 570 or another type of electrical connection) to the second end of the phase shift element 530. Accordingly, the amplified first RF signal produced by the GaN final stage IC die 504 is conveyed to the RF output terminal 550, and the output terminal 550 functions as a summing or combining node 572 for the amplified first and second RF signals. When the various phase shifts imparted separately on the first and second RF signals are substantially equal, the amplified first and second RF signals combine substantially in phase at combining node 572.

The RF output terminal 550 (and thus summing node 572) is electrically coupled (e.g., through wirebonds 574 or another type of electrical connection) to an output network 576, which functions to present the proper load impedances to each of carrier and peaking amplifier dies 504, 506. In addition, the output network 576 may include a decoupling capacitor 578, as shown. Although not shown in FIG. 5, the output network 576 may include various conductive traces, additional discrete components, and/or integrated components (e.g., capacitors, inductors, and/or resistors) to provide the desired impedance matching. The output network 576 is electrically coupled through the PCB 508 to conductive landing pad 514 exposed at the bottom surface of the PCB 508. The landing pad 514 functions as the RF output node for the Doherty power amplifier module 500.

In this disclosure, various embodiments of driver stage IC dies are described in which the IC dies are described as including SiGe substrates. It should be apparent that other configurations of driver stage IC dies may instead be utilized in which the driver stage IC dies are implemented using any suitable substrates for the fabrication of HBT devices, such as GaAs and InP. Accordingly, in this disclosure, driver stage IC dies described as being "SiGe dies" should be understood to also include IC dies with GaAs and InP materials.

An embodiment of a multiple-stage amplifier includes a substrate with a mounting surface, and a first power transistor die coupled to the mounting surface. The first power transistor die includes a first III-V semiconductor substrate, a first radio frequency (RF) signal input terminal, a first RF signal output terminal, and a first transistor. The first transistor has a first control terminal electrically coupled to the first RF signal input terminal and a first current-carrying terminal electrically coupled to the first RF signal output terminal. The amplifier includes a second power transistor die coupled to the mounting surface. The second power transistor die includes a second III-V semiconductor substrate, a second radio frequency (RF) signal input terminal, a second RF signal output terminal, and a second transistor. The second transistor has a second control terminal electrically coupled to the first RF signal input terminal, and a second current-carrying terminal electrically coupled to the first RF signal output terminal. The amplifier includes a third die coupled to the mounting surface. The third die includes at least one of silicon germanium (SiGe), gallium arsenide (GaAs), and indium phosphide (InP), a third RF signal input terminal, a third RF signal output terminal that is electrically connected to the first RF signal input terminal, a first amplification path between the third RF signal input terminal and the third RF signal output terminal, a fourth RF signal input terminal, a fourth RF signal output terminal that is electrically connected to the second RF signal input terminal, and a second amplification path between the fourth RF signal input terminal and the fourth RF signal output terminal. The amplifier includes a first connection electrically coupled between the second RF signal output terminal and the first RF signal input terminal.

In an embodiment, the first amplification path includes a first heterojunction bipolar transistor (HBT) transistor coupled between the third RF signal input terminal and the third RF signal output terminal and the second amplification path includes a second HBT coupled between the fourth RF signal input terminal and the fourth RF signal output terminal. In an embodiment, the first amplification path includes a third HBT coupled between the third RF signal input terminal and the third RF signal output terminal and the first HBT and the third HBT are connected in a cascode configuration and the second amplification path includes a fourth HBT coupled between the fourth RF signal input terminal and the fourth RF signal output terminal and the second HBT and the fourth HBT are connected in a cascode configuration. In an embodiment, the second amplification path includes a first variable capacitance, a first terminal of the first variable capacitance is electrically connected to a collector terminal of the fourth HBT, and a second terminal of the first variable capacitance is electrically connected to a base terminal of the second HBT. In an embodiment, the first amplification path includes a second variable capacitance, a first terminal of the second variable capacitance is electrically connected to a collector terminal of the third HBT, and a second terminal of the second variable capacitance is electrically connected to a base terminal of the first HBT. In an embodiment, the first amplification path extends in a first direction in the third die and the second amplification path extends in a second direction in the third die, and the first direction is rotationally offset from the second direction by 90 degrees. In an embodiment, the first power transistor die is a carrier amplifier die of a Doherty power amplifier, and the second power transistor die is a peaking amplifier die of the Doherty power amplifier. In an embodiment, the first III-V semiconductor substrate includes gallium nitride and the second III-V semiconductor substrate includes gallium nitride.

An embodiment of an amplifier includes a first radio frequency (RF) input terminal, a first driver amplifier module including a second RF input terminal electrically connected to the first RF input terminal, a first RF output terminal, and a first driver amplifier. The first driver amplifier includes a first heterojunction bipolar transistor (HBT) and a second HBT, and the first HBT is coupled to the second HBT in a cascode configuration. The amplifier includes a first power amplifier module including a third RF input terminal electrically connected to the first RF output terminal, a second RF output terminal, and a first power transistor coupled between the third RF input terminal and the second RF output terminal.

An embodiment of a device includes an integrated circuit (IC) die. The IC die includes a silicon germanium (SiGe) substrate. The device includes a first RF signal input terminal, a first RF signal output terminal, a first amplification path between the first RF signal input terminal and the first RF signal output terminal, a second RF signal input terminal, a second RF signal output terminal, and a second amplification path between the second RF signal input terminal and the second RF signal output terminal. The device includes a first power transistor die including a first input terminal electrically connected to the first RF signal output terminal and a second power transistor die including a second input terminal electrically connected to the second RF signal output terminal.

The preceding detailed description is merely illustrative in nature and is not intended to limit the embodiments of the subject matter or the application and uses of such embodiments. For example, although the above description discusses the use of a GaN final stage IC die in various embodiments, other types of III-V transistors (e.g., GaAs transistors, InP transistors, and so on) may be used as a final stage IC die, in other embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier, comprising:
a substrate with a mounting surface;
a first power transistor die coupled to the mounting surface, wherein the first power transistor die includes a first III-V semiconductor substrate, a first radio frequency (RF) signal input terminal, a first RF signal output terminal, and a first transistor, wherein the first transistor has a first control terminal electrically coupled to the first RF signal input terminal, and a first current-carrying terminal electrically coupled to the first RF signal output terminal;
a second power transistor die coupled to the mounting surface, wherein the second power transistor die includes a second III-V semiconductor substrate, a second radio frequency (RF) signal input terminal, a second RF signal output terminal, and a second transistor, wherein the second transistor has a second control terminal electrically coupled to the first RF signal input terminal, and a second current-carrying terminal electrically coupled to the first RF signal output terminal;
a third die coupled to the mounting surface, the third die includes at least one of silicon germanium (SiGe), gallium arsenide (GaAs), and indium phosphide (InP), a third RF signal input terminal, a third RF signal output terminal that is electrically connected to the first RF signal input terminal, a first amplification path between the third RF signal input terminal and the third RF signal output terminal, a fourth RF signal input terminal, a fourth RF signal output terminal that is electrically connected to the second RF signal input terminal, and a second amplification path between the fourth RF signal input terminal and the fourth RF signal output terminal, wherein the first amplification path includes a first heterojunction bipolar transistor (HBT) coupled between the third RF signal input terminal and the third RF signal output terminal and the second amplification path includes a second HBT coupled between the fourth RF signal input terminal and the fourth RF signal output terminal, wherein a first bias control circuit is coupled to a first base of the first HBT and a second bias control circuit is coupled to a second base of the second HBT, and wherein the third die includes a first variable capacitance, a first terminal of the first variable capacitance is electrically connected to a collector of the second HBT, and a second terminal of the first variable capacitance is electrically connected to the base of the first HBT; and a first connection electrically coupled between the second RF signal output terminal and the first RF signal output terminal.

2. The amplifier of claim 1, wherein the first amplification path includes a third HBT coupled between the third RF signal input terminal and the third RF signal output terminal and the first HBT and the third HBT are connected in a cascode configuration and the second amplification path includes a fourth HBT coupled between the fourth RF signal input terminal and the fourth RF signal output terminal and the second HBT and the fourth HBT are connected in a cascode configuration.

3. The amplifier of claim 2, wherein the second amplification path includes a first variable capacitance, a first terminal of the first variable capacitance is electrically connected to a collector terminal of the fourth HBT, and a second terminal of the first variable capacitance is electrically connected to a base terminal of the second HBT.

4. The amplifier of claim 2, wherein the first amplification path includes a second variable capacitance, a first terminal of the second variable capacitance is electrically connected to a collector terminal of the third HBT, and a second terminal of the second variable capacitance is electrically connected to a base terminal of the first HBT.

5. The amplifier of claim 1, wherein the first amplification path extends in a first direction in the third die and the second amplification path extends in a second direction in the third die, and the first direction is rotationally offset from the second direction by 90 degrees.

6. The amplifier of claim 1, wherein the first power transistor die is a carrier amplifier die of a Doherty power amplifier, and the second power transistor die is a peaking amplifier die of the Doherty power amplifier.

7. The amplifier of claim 1, wherein the first III-V semiconductor substrate includes gallium nitride and the second III-V semiconductor substrate includes gallium nitride.

8. An amplifier, comprising:
a first radio frequency (RF) input terminal;
a first driver amplifier module including a second RF input terminal electrically connected to the first RF input terminal, a first RF output terminal, and a first driver amplifier, wherein the first driver amplifier includes a first heterojunction bipolar transistor (HBT) a second HBT, and a bias control circuit, wherein the first HBT is coupled to the second HBT in a cascode configuration and wherein the bias control circuit is coupled to a base of the first HBT, and wherein the first driver amplifier includes a first variable capacitance, a first terminal of the first variable capacitance is electrically connected to a collector of the second HBT, and a second terminal of the first variable capacitance is electrically connected to the base of the first HBT; and
a first power amplifier module including a third RF input terminal electrically connected to the first RF output terminal, a second RF output terminal, and a first power transistor coupled between the third RF input terminal and the second RF output terminal.

9. The amplifier of claim 8, wherein the first driver amplifier module includes at least one of silicon germanium (SiGe), gallium arsenide (GaAs), and indium phosphide (InP).

10. The amplifier of claim 9, wherein the first power amplifier module includes a III-V semiconductor material.

11. The amplifier of claim 8, further comprising:
a fourth RF input terminal;
a second driver amplifier module including a fifth RF input terminal electrically connected to the fourth RF input terminal, a third RF output terminal, and a second driver amplifier, wherein the second driver amplifier includes a third HBT and a fourth HBT, and the third HBT is coupled to the fourth HBT in a cascode configuration; and
a second power amplifier module including a sixth RF input terminal electrically connected to the third RF output terminal, a fourth RF output terminal, and a second power transistor coupled between the sixth RF input terminal and the fourth RF output terminal, wherein the fourth RF output terminal is electrically connected to the second RF output terminal through an impedance inversion element.

12. The amplifier of claim 11, wherein the first driver amplifier module and the second driver amplifier module are in the same integrated circuit die.

13. The amplifier of claim 12, wherein the first driver amplifier module is rotationally offset from the second driver amplifier module by 90 degrees.

14. A device, comprising:
an integrated circuit (IC) die, wherein the IC die includes a silicon germanium (SiGe) substrate, a first RF signal input terminal, a first RF signal output terminal, a first amplification path between the first RF signal input terminal and the first RF signal output terminal, a second RF signal input terminal, a second RF signal output terminal, and a second amplification path between the second RF signal input terminal and the second RF signal output terminal, wherein the first amplification path includes a first heterojunction bipolar transistor (HBT) coupled between the first RF signal input terminal and the first RF signal output terminal, the second amplification path includes a second heterojunction bipolar transistor (HBT) coupled between the second RF signal input terminal and the second RF signal output terminal, wherein a first bias control circuit is coupled to a first base of the first HBT, and wherein a second bias control circuit is coupled to a second base of the second HBT, and wherein the IC die includes a first variable capacitance, a first terminal of the first variable capacitance is electrically connected to a collector of the second HBT, and a second terminal of the first variable capacitance is electrically connected to the base of the first HBT;

a first power transistor die connected between the RF signal input terminal and the first RF signal output terminal; and a second power transistor die connected between the second RF signal input terminal and the second RF signal output terminal.

15. The device of claim 14, wherein the first amplification path includes a third HBT coupled between the first RF signal input terminal and the first RF signal output terminal and the first HBT and the third HBT are connected in a cascode configuration and the second amplification path includes a fourth HBT coupled between the second RF signal input terminal and the second RF signal output terminal and the second HBT and the fourth HBT are connected in a cascode configuration.

16. The device of claim 15, wherein the second amplification path includes a first variable capacitance, a first terminal of the first variable capacitance is electrically connected to a collector terminal of the fourth HBT, and a second terminal of the first variable capacitance is electrically connected to a base terminal of the second HBT.

17. The device of claim 16, wherein the first amplification path includes a second variable capacitance, a first terminal of the second variable capacitance is electrically connected to a collector terminal of the third HBT, and a second terminal of the second variable capacitance is electrically connected to a base terminal of the first HBT.

18. The device of claim 14, wherein the first amplification path extends in a first direction in the IC die and the second amplification path extends in a second direction in the IC die, and the first direction is rotationally offset from the second direction by 90 degrees.

19. The amplifier of claim 8, wherein the bias control circuit is configured to control a small signal gain of the first driver amplifier.

20. The amplifier of claim 8, wherein the first variable capacitance is configured to control a gain slope of the first driver amplifier.

* * * * *